United States Patent
Patil et al.

(10) Patent No.: US 8,225,040 B1
(45) Date of Patent: Jul. 17, 2012

(54) SYSTEMS AND METHODS FOR REDUNDANT DATA STORAGE

(75) Inventors: Avinash Ramesh Patil, Maharashtra (IN); Dilip Renade, Maharashtra (IN)

(73) Assignee: Symantec Corporation, Mountain View, CA (US)

( * ) Notice: Subject to any disclaimer, the term of this patent is extended or adjusted under 35 U.S.C. 154(b) by 333 days.

(21) Appl. No.: 12/723,335

(22) Filed: Mar. 12, 2010

(51) Int. Cl.
*G06F 12/16* (2006.01)

(52) U.S. Cl. ......... 711/114; 711/161; 711/162; 714/6.2; 714/6.22; 714/6.23

(58) Field of Classification Search .................. 711/114, 711/161, 162; 714/6.2, 6.22, 6.23
See application file for complete search history.

(56) References Cited

U.S. PATENT DOCUMENTS

| | | | | |
|---|---|---|---|---|
| 4,602,350 | A * | 7/1986 | Gray | 711/220 |
| 6,848,022 | B2 * | 1/2005 | Nanda | 711/114 |
| 6,993,701 | B2 * | 1/2006 | Corbett et al. | 714/770 |
| 7,817,362 | B2 * | 10/2010 | Takahashi et al. | 360/31 |
| 7,975,102 | B1 * | 7/2011 | Hyer, Jr. et al. | 711/114 |
| 2004/0109365 | A1 * | 6/2004 | Stojancic | 365/200 |
| 2005/0086484 | A1 * | 4/2005 | Muratani | 713/176 |

OTHER PUBLICATIONS

Wikipedia; Annualized Failure Rate; http://en.wikipedia.org/wiki/Annualized_failure_rate.html; Taken from site on Feb. 23, 2010.
Vocal Technologies, LTD; Reed Solomon Software Performance; http://www.vocal.com/error_coding/reed_performance.html; Taken from site on Feb. 23, 2010.
Michael Luby; Benchmark Comparisons of Erasure Codes; http://www.icsi.berkeley,edu/-luby/erasure.html; Taken from site on Feb. 23, 2010.

* cited by examiner

*Primary Examiner* — Jae Yu
(74) *Attorney, Agent, or Firm* — Advantedge Law Group

(57) ABSTRACT

A computer-implemented method for redundant data storage may include identifying a storage system. The computer-implemented method may also include identifying a unit of data to be redundantly stored. The computer-implemented method may further include identifying an integer that represents the unit of data. The computer-implemented method may additionally include identifying a set of pairwise coprimes. The computer-implemented method may further include generating a set of shares, with each share including a reduction of the integer modulo a corresponding pairwise coprime in the set of pairwise coprimes. The computer-implemented method may also include redundantly storing the unit of data by storing the set of shares on the storage system. Various other methods and systems are also disclosed.

20 Claims, 8 Drawing Sheets

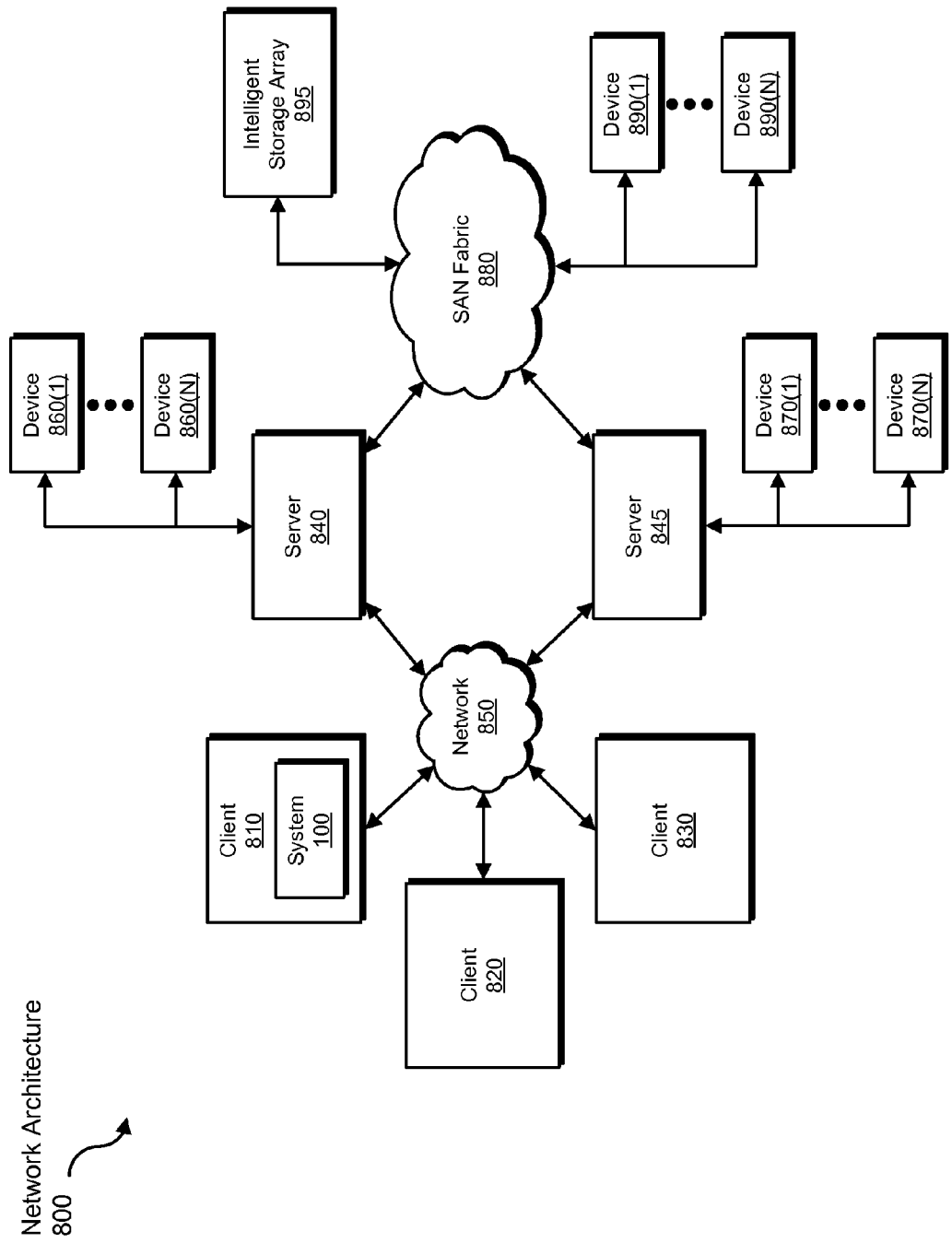

SYSTEMS AND METHODS FOR REDUNDANT DATA STORAGE

BACKGROUND

In the digital age, organizations increasingly rely on digitally stored data. To protect against data loss, an organization may use a redundant storage system to store important data. Redundant storage systems may store more information than is necessary to recover the underlying data, such that even if some information is lost (e.g., from damage to a storage device) the storage system may still fully recover the underlying data.

For example, a redundant storage system may apply an erasure code to data to be stored on the system, creating a number ("n") of data points to represent the data. Of the n data points, a certain number ("k") may suffice to retrieve the original data from the storage system. Unfortunately, erasure codes traditionally used in redundant storage systems (such as Tornado codes and Reed-Solomon error correction techniques) may suffer from various deficiencies. For example, redundant storage systems using Tornado codes may only provide probabilistic guarantees that k data points will suffice to retrieve the original data, such that there may exist a set of critical data points whose loss may result in data loss. Furthermore, attempting to identify such sets of critical data points may be difficult or inefficient. Additionally, redundant storage systems using Tornado codes may not use space efficiently.

Redundant storage systems using Reed-Solomon error correction techniques may suffer from other deficiencies. For example, encoding the data to be stored into the data points and then decoding these data points back into the original data may be computationally intensive. Furthermore, the encoding and decoding tasks may scale poorly (e.g., with quadratic time complexity). Redundant storage systems using Reed-Solomon error correction techniques may also perform poorly when k is significantly smaller than n. Additionally, computational resources for decoding may increase with the number of erasures (e.g., data points missing from the original n data points). Accordingly, the instant disclosure identifies and addresses a need for efficient and reliable redundant data storage.

SUMMARY

As will be described in greater detail below, the instant disclosure generally relates to systems and methods for redundant data storage. Embodiments of the instant disclosure may redundantly store data by using results related to the Chinese remainder theorem to encode data for redundant storage and/or decode data from redundant storage. For example, a method may include identifying a storage system, identifying a unit of data to be redundantly stored, identifying an integer that represents the unit of data, and identifying a set of pairwise coprimes. The method may also include generating a set of shares, where each share may include a reduction of the integer modulo a corresponding pairwise coprime in the set of pairwise coprimes. The method may additionally redundantly store the unit of data by storing the set of shares on the storage system.

The storage system may include a variety of systems. For example, the storage system may include a distributed storage system. Additionally or alternatively, the storage system may include an archival storage system.

Identifying the unit of data to be redundantly stored may happen in a variety of contexts. For example, the unit of data may include a stripe of data. Accordingly, identifying the unit of data may include identifying a volume of data to be redundantly stored, dividing the volume of data into a plurality of stripes, and selecting the stripe of data from the plurality of stripes.

Identifying the set of pairwise coprimes may include a variety of steps. For example, identifying the set of pairwise coprimes may include identifying a minimum number of shares to guarantee future decoding of the integer and selecting the set of pairwise coprimes such that a product of members of any subset of the set of pairwise coprimes with a cardinality equal to the minimum number of shares will exceed the value of the integer. Additionally or alternatively, identifying the set of pairwise coprimes may include selecting a number of pairwise coprimes equal to the number of shares to generate. In some examples, identifying the set of pairwise coprimes may include identifying a maximum share size and selecting the set of pairwise coprimes such that each pairwise coprime is small enough to be stored within the maximum share size.

In some examples, a method for redundant data storage may include identifying a storage system and identifying a set of pairwise coprimes. The method may also include retrieving a set of shares from the storage system, where each share includes a reduction of an integer modulo a corresponding pairwise coprime in the set of pairwise coprimes. The method may additionally include solving a system of simultaneous congruences, where each congruence in the system includes a congruence between the integer and a share in the set of shares modulo a corresponding pairwise coprime in the set of pairwise coprimes. The method may further include identifying a unit of data corresponding to the integer.

The storage system may include a variety of systems. For example, the storage system may include a distributed storage system. Additionally or alternatively, the storage system may include an archival storage system.

Solving the system of simultaneous congruences may include a variety of approaches. For example, solving the system of simultaneous congruences may include using an extended Euclidean algorithm.

In some contexts, the unit of data may include a portion of a larger volume of data. For example, the unit of data may include a stripe of data.

In some examples, a system for redundant data storage may include an identification module, an encoding module, a storage module, a retrieval module, and a decoding module. The identification module may be programmed to identify a storage system, identify a set of pairwise coprimes, and identify a unit of data to be redundantly stored. The encoding module may be programmed to identify an integer that represents the unit of data and to generate a set of shares, with each share including a reduction of the integer modulo a corresponding pairwise coprime in the set of pairwise coprimes. The storage module may be programmed to redundantly store the unit of data by storing the set of shares on the storage system. The retrieval module may be programmed to retrieve the set of shares from the storage system. The decoding module may be programmed to solve a system of simultaneous congruences, with each congruence in the system including a congruence between the integer and a share in the set of shares modulo a corresponding pairwise coprime in the set of pairwise coprimes. The decoding module may also be programmed to identify a unit of data corresponding to the integer.

The storage system may include a variety of systems. For example, the storage system may include a distributed storage system. Additionally or alternatively, the storage system may include an archival storage system.

The identification module may identify the unit of data to be redundantly stored in a variety of contexts. For example, the unit of data may include a stripe of data. Accordingly, the identification module may be programmed to identify the unit of data by identifying a volume of data to be redundantly stored, dividing the volume of data into a plurality of stripes, and selecting the stripe of data from the plurality of stripes.

The identification module may be programmed to identify the set of pairwise coprimes with a variety of steps. For example, the identification module may be programmed to identify the set of pairwise coprimes by identifying a minimum number of shares to guarantee future decoding of the integer and selecting the set of pairwise coprimes such that a product of members of any subset of the set of pairwise coprimes with a cardinality equal to the minimum number of shares will exceed the value of the integer. Additionally or alternatively, the identification module may be programmed to identify the set of pairwise coprimes by selecting a number of pairwise coprimes equal to the number of shares to generate.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 8 is a block diagram of an exemplary computing network capable of implementing one or more of the embodiments described and/or illustrated herein.

Figure 1:
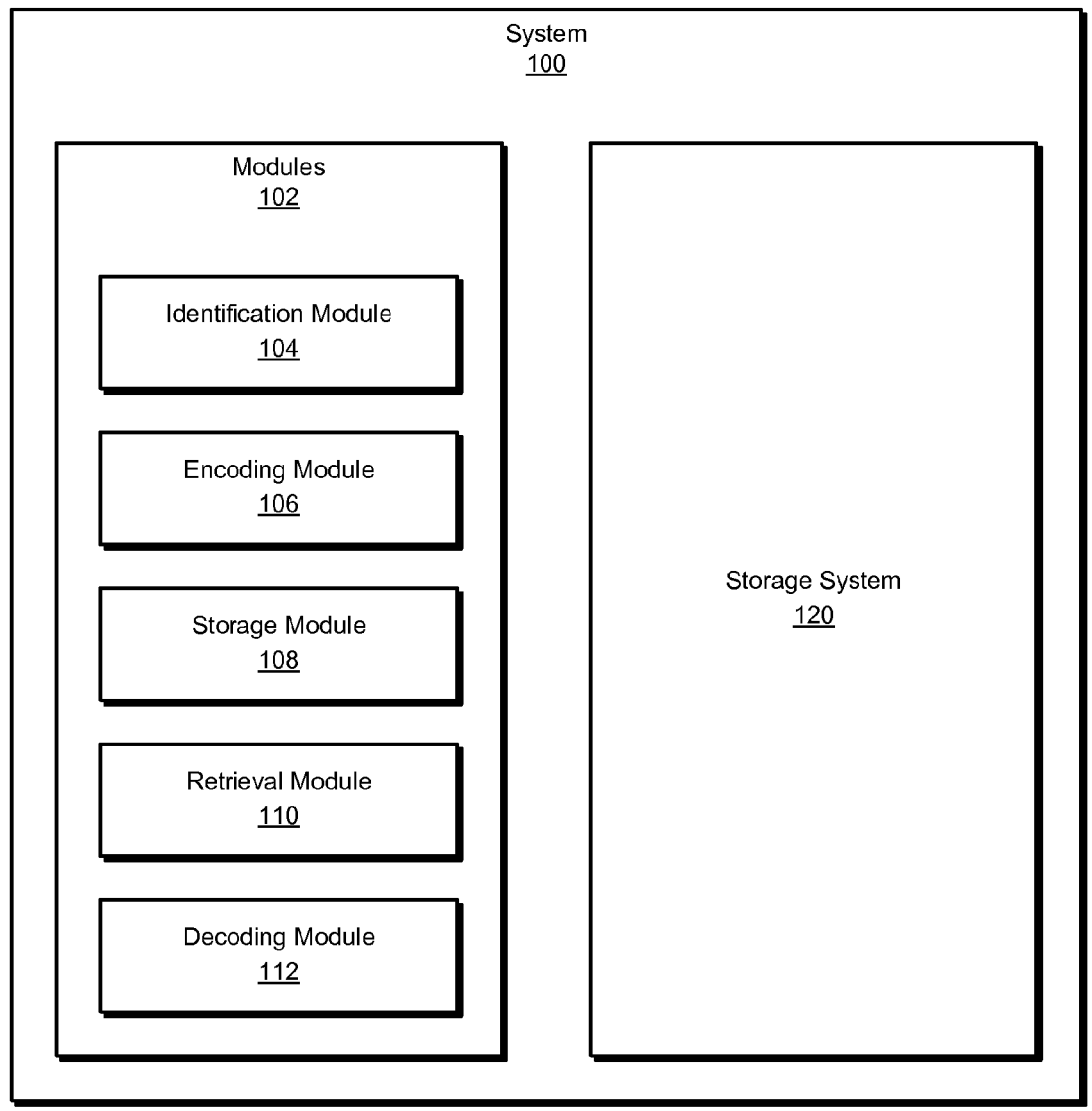
FIG. 1 is a block diagram of an exemplary system for redundant data storage.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

As will be described in greater detail below, the instant disclosure generally relates to systems and methods for redundant data storage. Systems and methods described herein may encode data for redundant storage and decode data from redundant storage by using results related to the Chinese remainder theorem. By representing a unit of data with an integer, generating shares that include reductions of the integer modulo corresponding coprimes, and storing the shares, the systems and methods described herein may efficiently encode the unit of data for redundant storage in terms of time (e.g., with a linear time complexity), computing resources, and storage resources. These systems and methods may also guarantee that a minimum threshold of shares suffice for decoding the unit of data from the shares. In addition, these systems and methods may efficiently decode the unit of data from the shares, potentially using fewer computing resources, performing the task in linear time, and performing efficiently even with many erasures (e.g., unreadable shares).

The following will provide, with reference to FIGS. 1, 2, 4, and 6, detailed descriptions of exemplary systems for redundant data storage. Detailed descriptions of corresponding computer-implemented methods will also be provided in connection with FIGS. 3 and 5. In addition, detailed descriptions of an exemplary computing system and network architecture capable of implementing one or more of the embodiments described herein will be provided in connection with FIGS. 7 and 8, respectively.

FIG. 1 is a block diagram of an exemplary system 100 for redundant data storage. As illustrated in this figure, exemplary system 100 may include one or more modules 102 for performing one or more tasks. For example, and as will be explained in greater detail below, exemplary system 100 may include an identification module 104 programmed to identify a storage system, identify a set of pairwise coprimes, and identify a unit of data to be redundantly stored. Exemplary system 100 may also include an encoding module 106 programmed to identify an integer that represents the unit of data and to generate a set of shares, with each share including a reduction of the integer modulo a corresponding pairwise coprime in the set of pairwise coprimes. Exemplary system 100 may additionally include a storage module 108 programmed to redundantly store the unit of data by storing the set of shares on the storage system.

In addition, and as will be described in greater detail below, exemplary system 100 may include a retrieval module 110 programmed to retrieve the set of shares from the storage system. Exemplary system may also include a decoding module 112 programmed to solve a system of simultaneous congruences, where each congruence in the system includes a congruence between the integer and a share in the set of shares modulo a corresponding pairwise coprime in the set of pairwise coprimes, and to identify a unit of data corresponding to the integer. Although illustrated as separate elements, one or more of modules 102 in FIG. 1 may represent portions of a single module or application.

In certain embodiments, one or more of modules 102 in FIG. 1 may represent one or more software applications or programs that, when executed by a computing device, may cause the computing device to perform one or more tasks. For example, as will be described in greater detail below, one or more of modules 102 may represent software modules stored and configured to run on one or more computing devices, such as the devices illustrated in FIG. 2 (e.g., computing system 202 and/or storage system 120), computing system 710 in FIG. 7, and/or portions of exemplary network architecture 800 in FIG. 8. One or more of modules 102 in FIG. 1 may also represent all or portions of one or more special-purpose computers configured to perform one or more tasks.

As illustrated in FIG. 1, exemplary system 100 may also include a storage system 120. Storage system 120 may represent portions of a single storage device or computing device or a plurality of storage devices or computing devices. For example, storage system 120 may represent primary storage device 732 and/or backup storage device 733 in FIG. 7, computing system 710 in FIG. 7, and/or portions of exemplary network architecture 800 in FIG. 8. Additionally or alternatively, storage system 120 in FIG. 1 may represent one or more physically separate devices capable of being accessed by a computing device, such as primary storage device 732 and/or backup storage device 733 in FIG. 7, computing system 710 in FIG. 7, and/or portions of exemplary network architecture 800 in FIG. 8.

Figure 2:
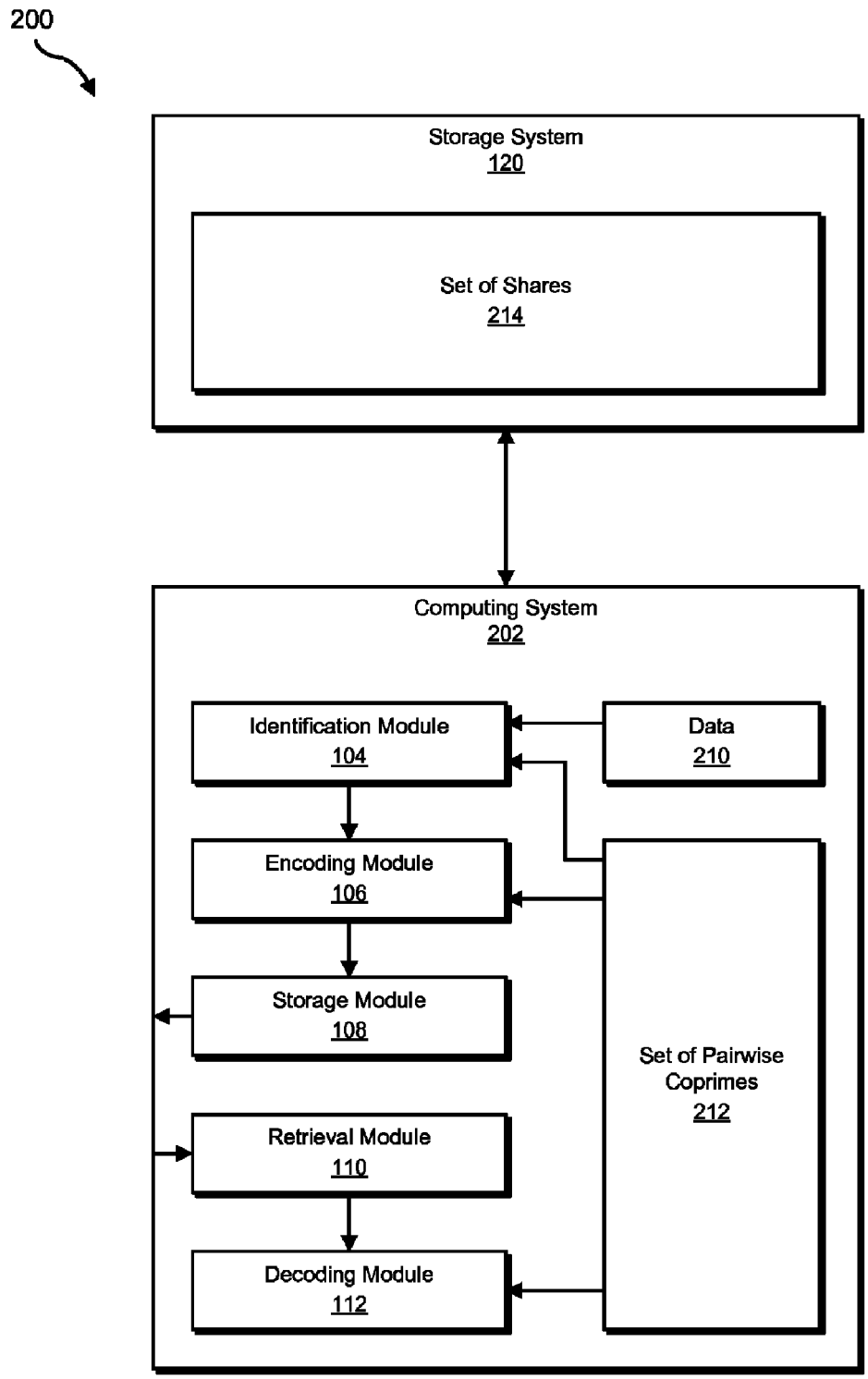
FIG. 2 is a block diagram of an exemplary system for redundant data storage.

Exemplary system 100 in FIG. 1 may be deployed in a variety of ways. For example, all or a portion of exemplary system 100 may represent portions of exemplary system 200 illustrated in FIG. 2. As shown in FIG. 2, system 200 may include a computing system 202 in communication with a storage system 120. In one embodiment, and as will be described in greater detail below, computing system 202 may include an identification module 104, an encoding module 106, a storage module 108, a retrieval module 110, and a decoding module 112.

Identification module 104 may be programmed to identify a storage system. For example, identification module 104 may identify storage system 120. Identification module 104 may also be programmed to identify a set of pairwise coprimes. For example, identification module 104 may identify a set of pairwise coprimes 212. Identification module 104 may also be programmed to identify a unit of data to be redundantly stored. For example, identification module 104 may identify data 210.

Encoding module 106 may be programmed to identify an integer that represents the unit of data. For example, encoding module 106 may be programmed to identify an integer that represents data 210. Encoding module 106 may also be programmed to generate a set of shares, with each share including a reduction of the integer modulo a corresponding pairwise coprime in the set of pairwise coprimes. For example, encoding module 106 may be programmed to generate a set of shares 214 (e.g., that includes reductions of the integer modulo corresponding coprimes in set of pairwise coprimes 212).

Storage module 108 may be programmed to redundantly store the unit of data by storing the set of shares on the storage system. For example, storage module 108 may be programmed to redundantly store data 210 by storing set of shares 214 on storage system 120.

Retrieval module 110 may be programmed to retrieve the set of shares from the storage system. For example, retrieval module 110 may be programmed to retrieve set of shares 214 from storage system 120.

Decoding module 112 may be programmed to solve a system of simultaneous congruences, where each congruence in the system includes a congruence between the integer and a share in the set of shares modulo a corresponding pairwise coprime in the set of pairwise coprimes. For example, decoding module 112 may solve a system of simultaneous congruences including congruences between the integer and shares in set of shares 214 modulo corresponding pairwise coprimes in set of pairwise coprimes 212. Decoding module 112 may also be programmed to identify the unit of data corresponding to the integer. For example, decoding module 112 may be programmed to identify data 210 (e.g., so as to read and/or restore it).

Computing system 202 generally represents any type or form of computing device capable of reading computer-executable instructions. Examples of computing system 202 include, without limitation, laptops, desktops, servers, cellular phones, personal digital assistants (PDAs), multimedia players, embedded systems, combinations of one or more of the same, exemplary computing system 710 in FIG. 7, or any other suitable computing device.

Figure 3:
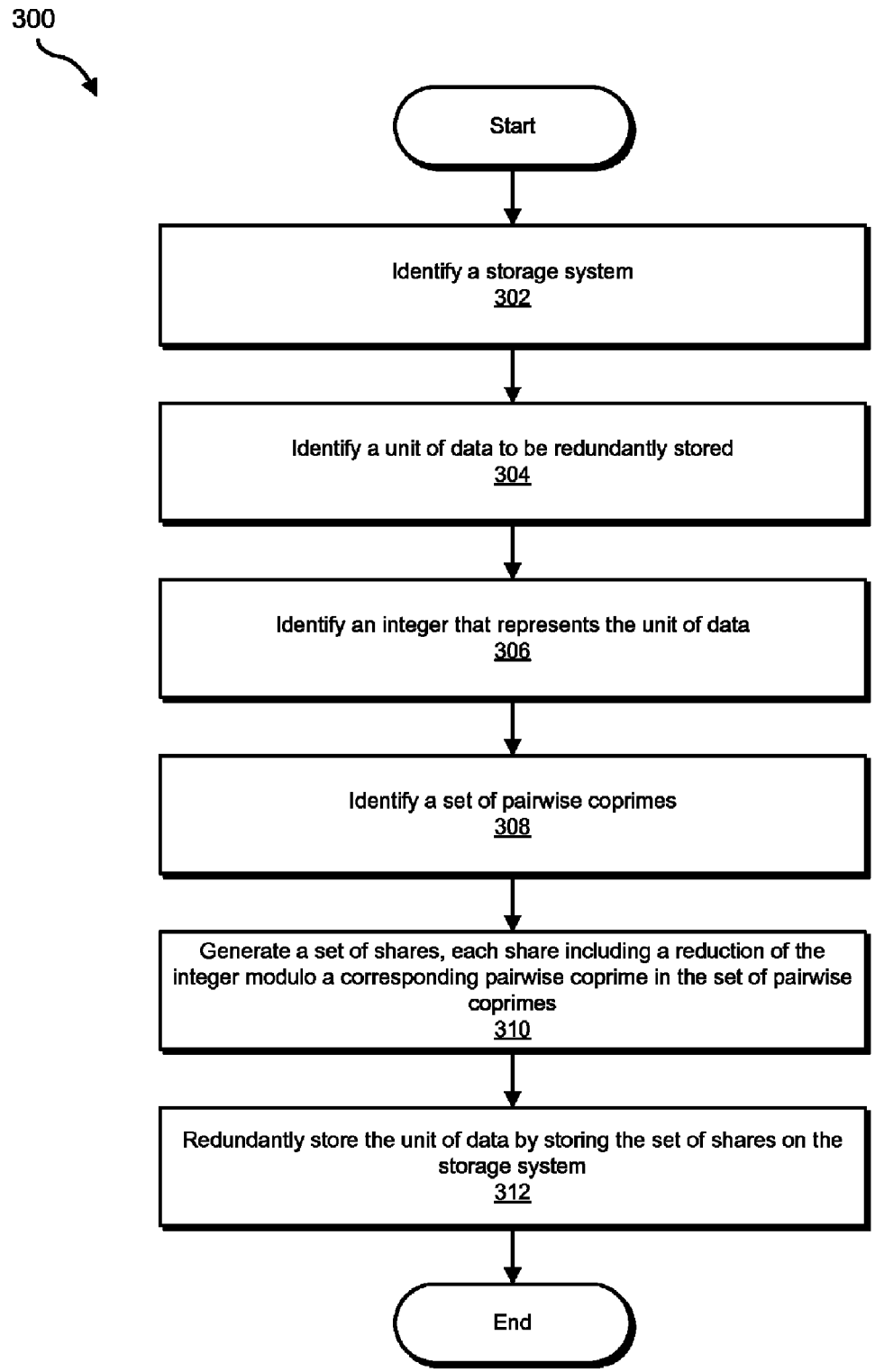
FIG. 3 is a flow diagram of an exemplary method for redundant data storage.

FIG. 3 is a flow diagram of an exemplary computer-implemented method 300 for redundant data storage. The steps shown in FIG. 3 may be performed by any suitable computer-executable code and/or computing system. In some embodiments, the steps shown in FIG. 3 may be performed by one or more of the components of system 100 in FIG. 1 and/or system 200 in FIG. 2.

As illustrated in FIG. 3, at step 302 one or more of the systems described herein may identify a storage system. For example, at step 302 identification module 104 may, as part of computing system 202 in FIG. 2, identify storage system 120.

Identification module 104 may perform step 302 in any suitable manner. For example, identification module 104 may read from a configuration file that identifies the storage system. Additionally or alternatively, identification module 104 may receive a message that identifies the storage system.

Figure 4:
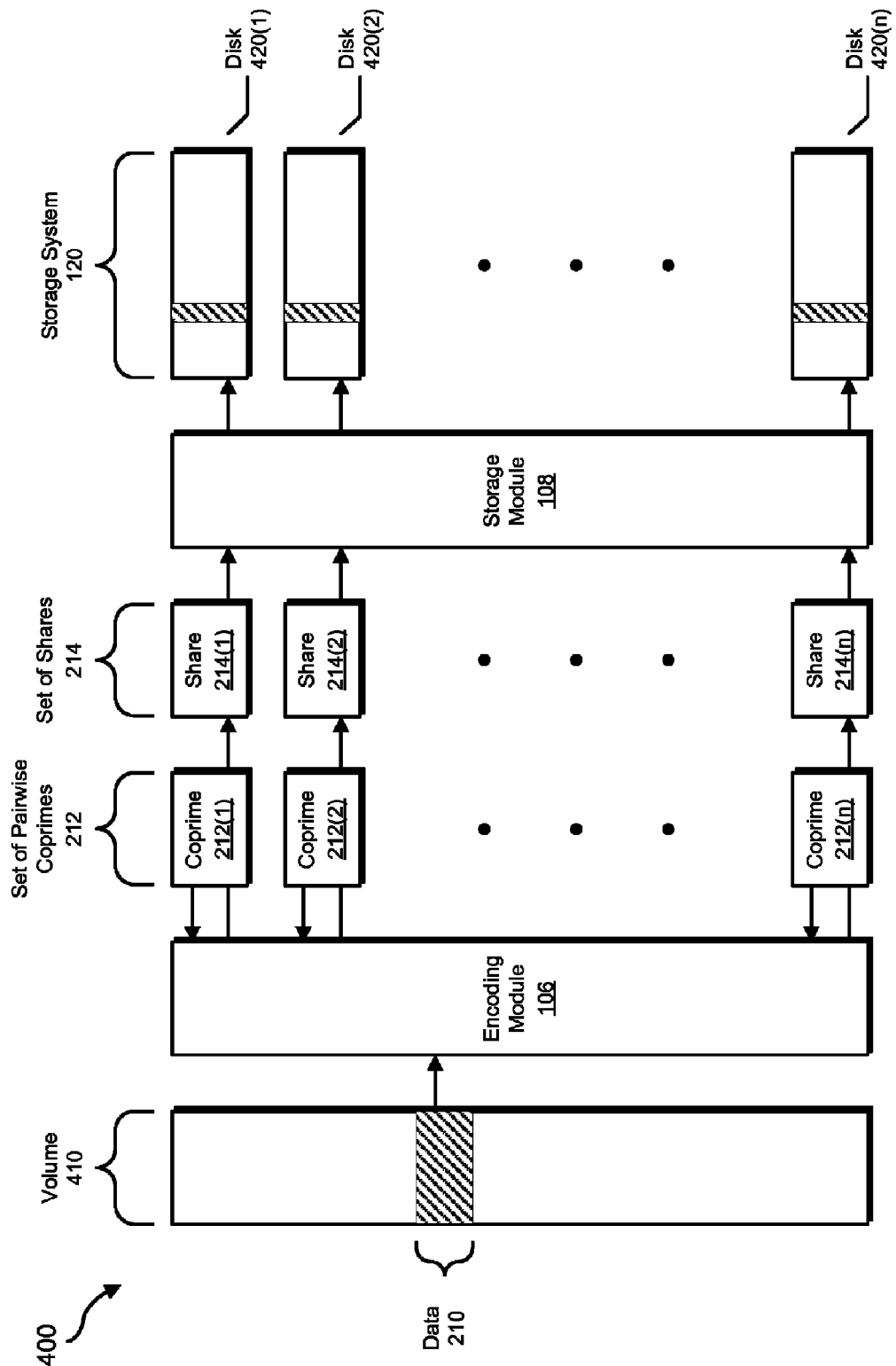
FIG. 4 is a block diagram of an exemplary system for redundant data storage.

As used herein, the term "storage system" may refer to any system for storing data. In some examples, the storage system may include a single storage device. Additionally or alternatively, the storage system may include multiple storage devices and/or a portion of multiple storage devices. For example, the storage system may include a distributed storage system, such as a disk array, a set of storage devices located at different geographical sites, and/or cloud storage. For example, FIG. 4 illustrates an exemplary system 400 for redundant data storage. As shown in FIG. 4, storage system 120 may include disks 420(1)-420(n).

In some examples, the storage system may include an archival storage system. For example, the storage system may be configured for long-term storage of data that must be retained but which may be infrequently accessed. In some examples, the storage system may be configured to allow for a predetermined device failure rate without data loss. For example, the storage system may include a group of 100 disks. The annualized failure rate for the group of disks may be 1.25%. A policy to retain archived data for 20 years may therefore mean that the archival storage system may be configured to count on about 25 of the disks failing by the end of the 20 years.

Returning to FIG. 3, at step 304 one or more of the systems described herein may identify a unit of data to be redundantly stored. For example, at step 304 identification module 104 may, as part of computing system 202 in FIG. 2, identify data 210 to be redundantly stored (e.g., on storage system 120).

As used herein, the term "unit of data" may refer to any suitable unit of data, including but not limited to a block, a region, a cluster, a sector, a file, and/or a unit of data of arbitrary size. In some examples, the unit of data may include a stripe. As used herein, the term "stripe" may refer to any segment of data assignable to multiple storage locations (e.g., multiple storage devices, multiple logical locations within a storage cloud, etc.) The stripe may be any suitable size (e.g., the stripe may be larger, smaller, or equal to a block). In these examples, identifying the unit of data may include identifying a volume of data to be redundantly stored, dividing the volume of data into a plurality of stripes, and selecting the stripe of data from the plurality of stripes. As used herein, the term "volume" may refer to any suitable collection of data. Using FIG. 4 as an example, a unit of data (e.g., data 210) may include a stripe of a volume 410. As will be described in greater detail below, the systems and methods described herein may encode and store data 210 across disks 420(1)-(n) of storage system 120.

Identifying the unit of data to be redundantly stored may include any suitable requirement and/or parameter for the redundant storage. For example, identification module 104 may identify a requirement that the encoded unit of data be stored across n disks and that any k of those disks must suffice to decode the unit of data (using an earlier example, that the encoded unit of data be stored across 100 disks, and that any 75 of those disks must suffice to decode the unit of data).

Returning to FIG. 3, at step 306 one or more of the systems described herein may identify an integer that represents the unit of data. For example, at step 306 encoding module 106 may, as part of computing system 202 in FIG. 2, identify an integer that represents data 210.

Identification module 104 may perform step 306 in any suitable manner. For example, identification module 104 may identify the integer that represents the unit of data by loading, typecasting, and/or interpreting the unit of data as an unsigned number (e.g., if the unit of data consists of an all-zero bit string, identification module 104 may identify the integer as zero). Generally, identification module 104 may perform any mapping function to convert the unit of data to and/or interpret the unit of data as an integer. In some examples, systems and methods described herein may perform operations on the unit of data that are isomorphic to modular arithmetic operations. In these examples, identification module 104 may identify the integer simply by identifying the unit of data for the isomorphic operations.

At step 308, one or more of the systems described herein may identify a set of pairwise coprimes. For example, at step 308 identification module 104 may, as part of computing system 202 in FIG. 2, identify a set of pairwise coprimes 212. As used herein, the phrase "set of pairwise coprimes" may refer to a set of integers wherein the greatest common divisor of each pair of integers in the set is equal to one. For example, the set {2, 7, 11, 15} may be a set of pairwise coprimes (e.g., even though 15 is not prime, neither 3 nor 5 is a divisor to 2, 7, or 11). In some examples, the set of pairwise coprimes may include only prime numbers.

Identification module 104 may perform step 308 in any suitable manner. For example, identification module 104 may identify a preselected set of pairwise coprimes in memory and/or in a file. In some examples, identification module 104 may use the same preselected set of pairwise coprimes for every unit of data in a volume of data.

As will be explained below, when encoding the unit of data, encoding module 106 may generate a number of shares to store on the storage system. As used herein, the term "share" may refer to an encoded portion of data, which, in combination with one or more other shares, may be used to reconstitute the data. Furthermore, encoding module 106 may generate each share based on a corresponding coprime. Accordingly, in some examples identification module 104 may identify the set of pairwise coprimes by selecting a number of pairwise coprimes equal to the number of shares to generate. For example, as mentioned above, identification module 104 may identify a requirement that the encoded unit of data be stored across a predetermined number of disks (e.g., one share to be stored on each disk). Using FIG. 4 as an example, identification module 104 may determine that data 210 is to be redundantly stored as n encoded shares (e.g., shares 214(1)-(n)) across n disks (e.g., disks 420(1)-(n)). Identification module 104 may accordingly select n coprimes (e.g., coprimes 212(1)-(n)) for the purpose of generating the n shares.

In some examples, identification module 104 may identify the set of pairwise coprimes by first identifying a minimum number of shares to guarantee future decoding of the integer (e.g., the unit of data). Using an earlier example, a redundant storage scheme may specify that 100 shares are to be generated from the integer and that any 75 of those shares must suffice for reconstituting the integer. After identifying the minimum number of shares, identification module 104 may select the set of pairwise coprimes such that a product of members of any subset of the set of pairwise coprimes with a cardinality equal to the minimum number of shares will exceed the value of the integer.

For example, the number of shares to be generated ("n") may be four, and the minimum number of shares ("k") to guarantee future decoding of the integer may be three. The integer ("x") may be an eight-bit number (e.g., anywhere from 0 to 255). Identification module 104 may accordingly select a set of four pairwise coprimes such that the product of any three of the pairwise coprimes is greater than 255. For example, identification module 104 may reject a potential set of pairwise coprimes {3, 7, 11, 13} because (3)(7)(11)=231 and 231 is less than 255. However, identification module 104 may select a set of pairwise coprimes {5, 7, 11, 13} because the smallest product of a subset of three of the members is 385, which is greater than 255. As will be explained below, by ensuring this condition, the systems and methods described herein may ensure that decoding module 112 can decode the integer using any k shares.

In some examples, identification module 104 may identify the set of pairwise coprimes by identifying a maximum share size. For example, the storage system may be configured to allocate 1024 bits for each share, and identification module 104 may accordingly identify the maximum size as 1024 bits. Identification module 104 may then select the set of pairwise coprimes such that each pairwise coprime is small enough to be stored within the maximum share size. Using the above example, identification module 104 may select the set of pairwise coprimes such that each pairwise coprime can be expressed in 1024 bits (e.g., is less than $2^{1024}$). As will be explained below, the size of each pairwise coprime may limit the size of each corresponding share.

Returning to FIG. 3, at step 310 one or more of the systems described herein may generate a set of shares, with each share including a reduction of the integer modulo a corresponding pairwise coprime in the set of pairwise coprimes. For example, at step 310 encoding module 106 may, as part of computing system 202 in FIG. 2, generate set of shares 214 using set of pairwise coprimes 212. Using FIG. 4 as an additional example, encoding module 106 may generate: share 214(1) as the reduction of the integer (e.g., that represents data 210) modulo coprime 214(1), share 214(2) as the reduction of the integer modulo coprime 214(2), share 214(n) as the reduction of the integer modulo coprime 214(n), etc.

As used herein, the term "modulo" (or "mod") may refer to a qualifier in modular arithmetic that may give rise to equivalence relations within one or more sets of integers. For example, 3, 11, 19, and 27 (modulo 8) may all be congruent with 3, as may any number 3+8n (modulo 8) wherein n is an integer. Additionally or alternatively, "modulo" or "mod" may refer to an operation to find the least non-negative member of an equivalence class. For example, 19 modulo 8 may equal 3. In some examples, evaluating x modulo y may include calculating the remainder of x/y. For example, to evaluate 19 modulo 8, methods and systems described herein may perform an integer division to determine that 8 divides into 19 twice, leaving a remainder of 3 (e.g., 19−8*2=3).

Encoding module 106 may perform step 310 in any suitable matter. For example, encoding module 106 may generate the set of shares by dividing the integer by the value of each coprime and using the remainder as a corresponding share. For example, the integer may be 26 and the set of pairwise coprimes may be {2, 3, 5, 7}. In this example, encoding module 106 may perform the following operations:

26 mod 2=0
26 mod 3=2
26 mod 5=1
26 mod 7=5 and accordingly generate {0, 2, 1, 5} as the set of shares. As noted earlier, in this manner each share may be smaller than its corresponding coprime. Accordingly, by limiting the size of the coprimes in the set of pairwise coprimes, the systems and methods described herein may ensure that each share may fit in its allocated space.

Returning to FIG. 3, at step 312 one or more of the systems described herein may redundantly store the unit of data by storing the set of shares on the storage system. For example, at step 312 storage module 108 may, as part of computing system 202 in FIG. 2, redundantly store data 210 by storing set of shares 214 on storage system 120. Using FIG. 4 as an additional example, storage module 108 may redundantly store data 210 by storing shares 214(1)-(n) on disks 420(1)-(n).

Storage module 108 may perform step 312 in any suitable manner. For example, storage module 108 may store the set of shares on the storage system by storing one share on each storage device of the storage system. In some examples, storage module 108 may store the set of shares as a stripe, storing each share at the same logical address of its respective storage device. Generally, storage module 108 may store each share such that the share may later be read and associated with its corresponding coprime. Upon completion of step 312, exemplary method 300 in FIG. 3 may terminate.

Figure 5:
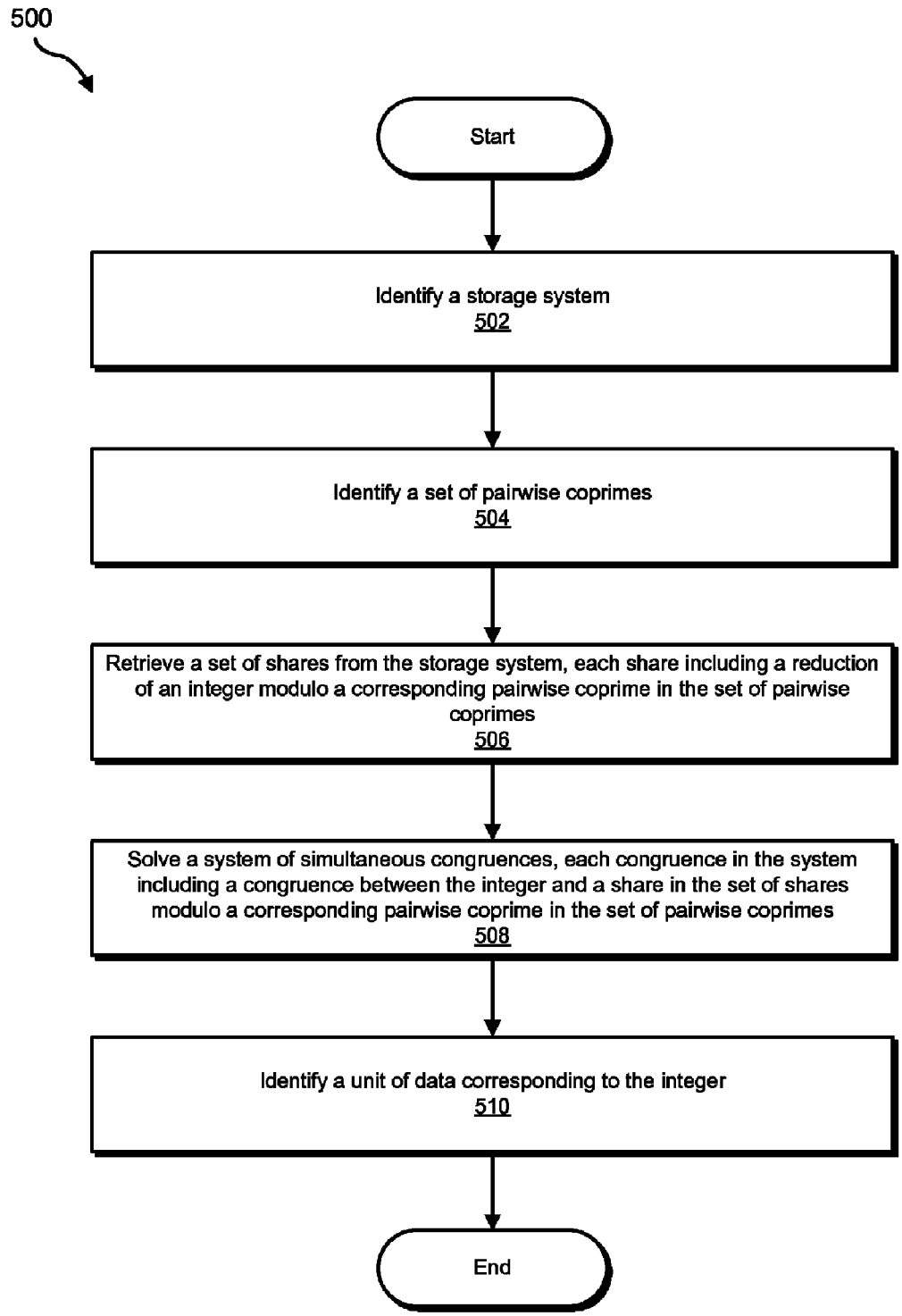
FIG. 5 is a flow diagram of an exemplary method for redundant data storage.

FIG. 5 is a flow diagram of an additional exemplary computer-implemented method 500 for redundant data storage. The steps shown in FIG. 5 may be performed by any suitable computer-executable code and/or computing system. In some embodiments, the steps shown in FIG. 5 may be performed by one or more of the components of system 100 in FIG. 1 and/or system 200 in FIG. 2.

As illustrated in FIG. 5, at step 502 one or more of the systems described herein may identify a storage system. For example, at step 502 identification module 104 may, as part of computing system 202 in FIG. 2, identify storage system 120.

Identification module 104 may perform step 502 in any suitable manner. For example, identification module 104 may read from a configuration file that identifies the storage system. Additionally or alternatively, identification module 104 may receive a message that identifies the storage system (e.g., as part of a reading and/or retrieval operation).

Figure 6:
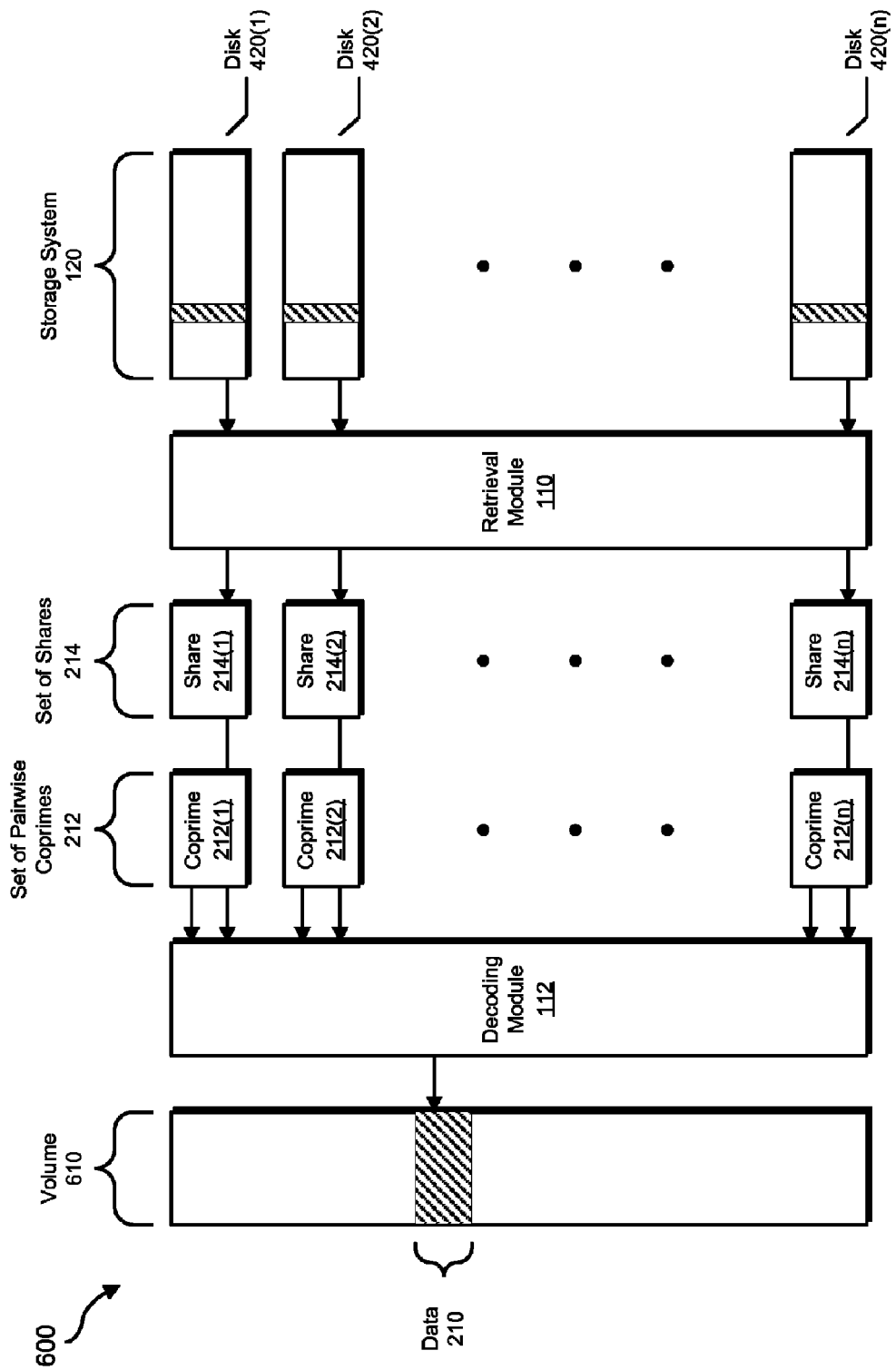
FIG. 6 is a block diagram of an exemplary system for redundant data storage.

Generally, the storage system identified in step 502 may include any attributes included in the description of the storage system referenced in step 302 of FIG. 3. In some examples, the storage system may include a single storage device. Additionally or alternatively, the storage system may include multiple storage devices and/or a portion of multiple storage devices. For example, the storage system may include a distributed storage system, such as a disk array, a set of storage devices located at different geographical sites, and/or cloud storage. For example, FIG. 6 illustrates an exemplary system 600 for redundant data storage. As shown in FIG. 6, storage system 120 may include disks 420(1)-420(n).

In some examples, the storage system may include an archival storage system. For example, the storage system may be configured for long-term storage of data that must be retained but which may be infrequently accessed. In some examples, the storage system may be configured to allow for a predetermined device failure rate without data loss. For example, the storage system may include a group of 100 disks. The annualized failure rate for the group of disks may be 1.25%. A policy to retain archived data for 20 years may therefore mean that the archival storage system may be configured to count on about 25 of the disks failing by the end of the 20 years.

At step 504, one or more of the systems described herein may identify a set of pairwise coprimes. For example, at step 504 identification module 104 may, as part of computing system 202 in FIG. 2, identify set of pairwise coprimes 212. Using FIG. 6 as an additional example, identification module 104 may identify coprimes 212(1)-(n).

Identification module 104 may perform step 504 in any suitable manner. For example, identification module 104 may identify a preselected set of pairwise coprimes in memory and/or in a file. In some examples, identification module 104 may use the same set of pairwise coprimes for all encoded units of data stored as sets of shares on the storage system. In certain examples, identification module 104 may identify each pairwise coprime in the set of pairwise coprimes by reading each pairwise coprime from a corresponding storage device in the storage system. Using FIG. 6 as an example, disk 420(1) may store coprime 212(1), disk 420(2) may store coprime 212(2), etc.

Returning to FIG. 5, at step 506 one or more of the systems described herein may retrieve a set of shares from the storage system, with each share including a reduction of an integer modulo a corresponding pairwise coprime in the set of pairwise coprimes. For example, at step 506 retrieval module 110 may, as part of computing system 202 in FIG. 2, retrieve set of shares 214 from storage system 120. Using FIG. 6 as an additional example, retrieval module 110 may retrieve shares 214(1)-(n) from disks 420(1)-(n).

Retrieval module may perform step 506 in any suitable manner. For example, retrieval module 110 may retrieve each share in the set of shares by reading from a corresponding storage device in the storage system. In some examples, retrieval module 110 may consult an index to determine the location of each share in the set of shares in order to retrieve each share.

At step 508, one or more of the systems described herein may solve a system of simultaneous congruences, with each congruence in the system including a congruence between the integer and a share in the set of shares modulo a corresponding pairwise coprime in the set of pairwise coprimes. For example, at step 508 decoding module 112 may, as part of computing system 202 in FIG. 2, solve a system of simultaneous congruences involving the integer representing data 210, set of shares 214, and set of pairwise coprimes 212. Using FIG. 6 as an additional example, decoding module 112 may solve a system of simultaneous congruences to find the value of the integer including: a congruence between the integer and share 214(1) modulo coprime 212(1), a congruence between the integer and share 214(2) modulo coprime 212(2), a congruence between the integer and share 214(n) modulo coprime 212(n), etc.

Decoding module 112 may perform step 508 in any suitable manner. For example, decoding module 112 may use results from a Chinese remainder theorem and/or an extended Euclidean algorithm to solve for an integer that fits the system of congruences. In some examples, the set of congruences may only involve some of the shares and corresponding coprimes. For example, if some disks in the storage system are lost, the set of congruences may only include congruences involving shares stored on the remaining disks of the storage system and their corresponding coprimes.

For example, the system of simultaneous congruences may be:

$x \equiv s_1 \pmod{c_1}$
$x \equiv s_2 \pmod{c_2}$
...
$x \equiv s_n \pmod{C_n}$ where x is the integer to solve for, $\{s_1, s_2, \ldots, s_n\}$ is the set of remaining shares, and $\{c_1, c_2, \ldots, c_n\}$ is the set of corresponding pairwise coprimes.

In some examples, to solve this system of simultaneous congruences decoding module 112 may evaluate:

$$x \equiv \sum_{i=1}^{n} (s_i)(y_i)(m_i)$$

where $$m_i = \prod_{j=1, j \neq i}^{n} c_j$$

and $y_i M_i \equiv 1 \pmod{m_i}, 1 \leq i \leq n,$ which decoding module 112 may solve using an extended Euclidean algorithm (e.g., to solve for $y_i$).

For example, if the set s of shares is $\{0, 2, 1, 5\}$ and the set c of pairwise coprimes is $\{2, 3, 5, 7\}$, then decoding module 112 may calculate set m as $\{(3)(5)(7), (2)(5)(7), (2)(3)(7), (2)(3)(5)\} = \{105, 70, 42, 30\}$. Decoding module 112 may then determine that the set y is $\{1, 1, 3, 4\}$ using an extended Euclidean algorithm. E.g., (1) (105) 1 (mod 2)
(1) (70) 1 (mod 3)
(3) (42) 1 (mod 5)
(4)(30) 1 (mod 7)

Decoding module 112 may then evaluate the congruence:

$$x \equiv \sum_{i=1}^{n} (s_i)(y_i)(m_i)$$

as:

$x \equiv (0)(1)(105) + (2)(1)(70) + (1)(3)(42) + (5)(4)(30)$
$\equiv 0 + 140 + 126 + 600$
$\equiv 866$ and:

$x \equiv 866 \pmod{210}$
$\equiv 26 \pmod{210}$

In this example, decoding module 112 may determine that the integer originally encoded into the set of shares was 26.

At step 510, one or more of the systems described herein may identify a unit of data corresponding to the integer. For example, at step 510 decoding module 112 may, as part of computing system 202 in FIG. 2, identify data 210 (e.g., derive data 210 from the integer).

Decoding module 112 may identify the unit of data corresponding to the integer in any suitable manner. For example, decoding module 112 may convert the integer into a bit string of a predetermined length. In some examples, decoding module 112 may restore the unit of data (e.g., to its original location on a volume).

The systems and methods described herein may operate in a variety of ways. For example, a redundant data storage scheme may specify generating 100 shares from a stripe of data and requiring only 75 shares to recover the stripe of data. The data stripe size may be 74 kilobytes. The systems and methods described herein may choose pairwise coprimes that are 1024-byte numbers, thereby allowing their remainders to fit in 1024 bytes. The systems and methods described herein may divide the 74 kilobyte data stripe into 100 shares of 1 kilobyte each (e.g., for a total of 100 kilobytes) stored on 100 separate disks. These systems and methods may later reconstruct the original data, even if 25 of the 100 disks fail.

By representing a unit of data with an integer, generating shares include reductions of the integer modulo corresponding coprimes, and storing the shares, the systems and methods described herein may efficiently encode the unit of data for redundant storage in terms of time (e.g., with a linear time complexity), computing resources, and storage resources. The systems and methods described herein may also guarantee that a minimum threshold of shares suffice for decoding the unit of data from the shares. These systems and methods may also efficiently decode the unit of data from the shares, potentially using fewer computing resources, performing the task in linear time, and/or performing the operation efficiently even with many erasures (e.g., unreadable shares).

The systems and methods described herein may be deployed in a variety of ways. For example, all or a portion of exemplary system 100 may represent portions of a cloud-computing or network-based environment. Cloud-computing environments may provide various services and applications via the Internet. These cloud-based services (e.g., software as a service, platform as a service, infrastructure as a service, etc.) may be accessible through a web browser or other remote interface. Various functions described herein may be provided through a remote desktop environment or any other cloud-based computing environment.

Figure 7:
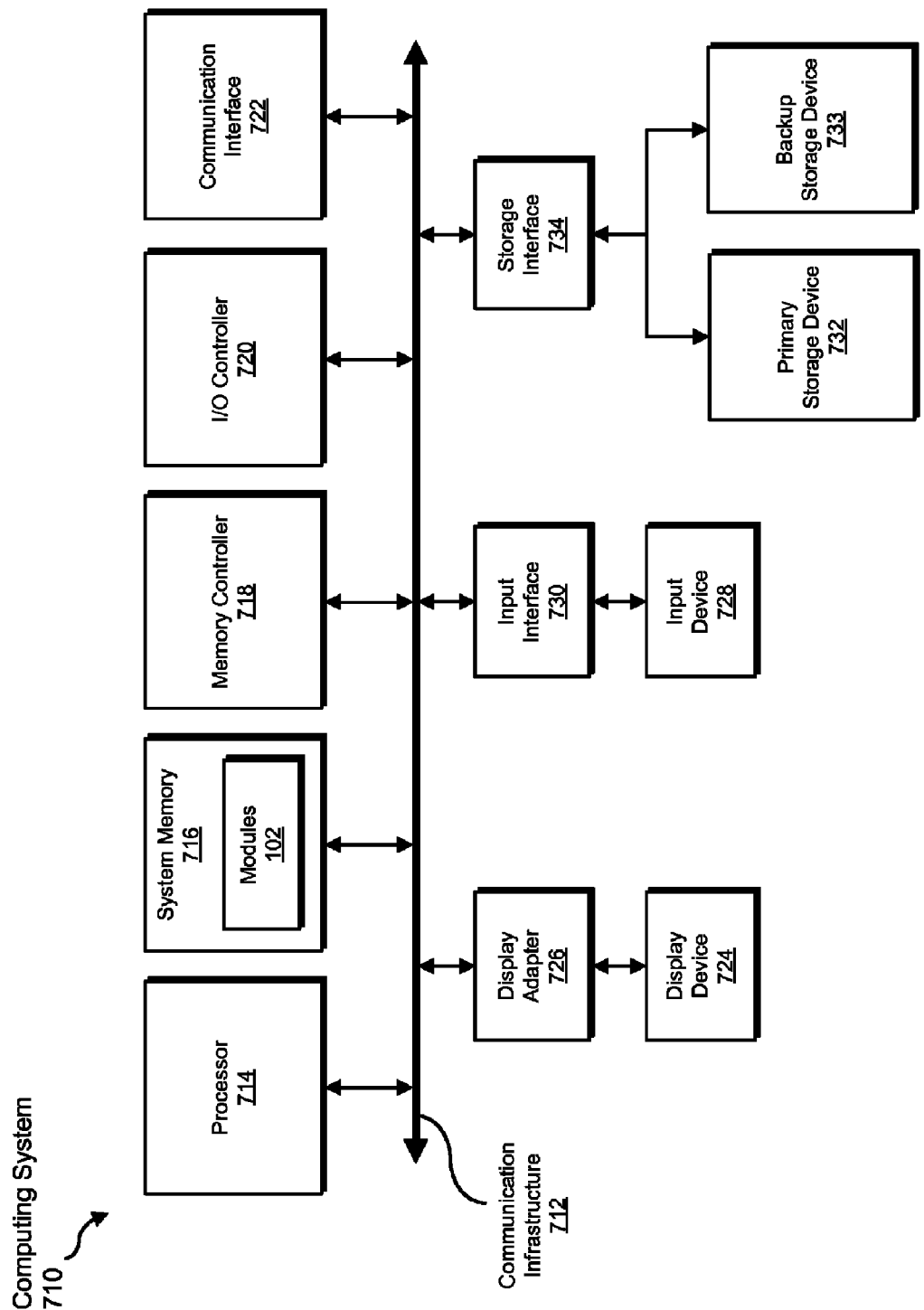
FIG. 7 is a block diagram of an exemplary computing system capable of implementing one or more of the embodiments described and/or illustrated herein.

FIG. 7 is a block diagram of an exemplary computing system 710 capable of implementing one or more of the embodiments described and/or illustrated herein. Computing system 710 broadly represents any single or multi-processor computing device or system capable of executing computer-readable instructions. Examples of computing system 710 include, without limitation, workstations, laptops, client-side terminals, servers, distributed computing systems, handheld devices, or any other computing system or device. In its most basic configuration, computing system 710 may include at least one processor 714 and a system memory 716.

Processor 714 generally represents any type or form of processing unit capable of processing data or interpreting and executing instructions. In certain embodiments, processor 714 may receive instructions from a software application or module. These instructions may cause processor 714 to perform the functions of one or more of the exemplary embodiments described and/or illustrated herein. For example, processor 714 may perform and/or be a means for performing, either alone or in combination with other elements, one or more of the identifying, selecting, generating, storing, retrieving, solving, and/or using steps described herein. Processor 714 may also perform and/or be a means for performing any other steps, methods, or processes described and/or illustrated herein.

System memory 716 generally represents any type or form of volatile or non-volatile storage device or medium capable of storing data and/or other computer-readable instructions. Examples of system memory 716 include, without limitation, random access memory (RAM), read only memory (ROM), flash memory, or any other suitable memory device. Although not required, in certain embodiments computing system 710 may include both a volatile memory unit (such as, for example, system memory 716) and a non-volatile storage device (such as, for example, primary storage device 732, as described in detail below). In one example, one or more of modules 102 from FIG. 1 may be loaded into system memory 716.

In certain embodiments, exemplary computing system 710 may also include one or more components or elements in addition to processor 714 and system memory 716. For example, as illustrated in FIG. 7, computing system 710 may include a memory controller 718, an input/output (I/O) controller 720, and a communication interface 722, each of which may be interconnected via a communication infrastructure 712. Communication infrastructure 712 generally represents any type or form of infrastructure capable of facilitating communication between one or more components of a computing device. Examples of communication infrastructure 712 include, without limitation, a communication bus (such as an ISA, PCI, PCIe, or similar bus) and a network.

Memory controller 718 generally represents any type or form of device capable of handling memory or data or controlling communication between one or more components of computing system 710. For example, in certain embodiments memory controller 718 may control communication between processor 714, system memory 716, and I/O controller 720 via communication infrastructure 712. In certain embodiments, memory controller 718 may perform and/or be a means for performing, either alone or in combination with other elements, one or more of the steps or features described and/or illustrated herein, such as identifying, selecting, generating, storing, retrieving, solving, and/or using.

I/O controller 720 generally represents any type or form of module capable of coordinating and/or controlling the input and output functions of a computing device. For example, in certain embodiments I/O controller 720 may control or facilitate transfer of data between one or more elements of computing system 710, such as processor 714, system memory 716, communication interface 722, display adapter 726, input interface 730, and storage interface 734. I/O controller 720 may be used, for example, to perform and/or be a means for performing, either alone or in combination with other elements, one or more of the identifying, selecting, generating, storing, retrieving, solving, and/or using steps described herein. I/O controller 720 may also be used to perform and/or be a means for performing other steps and features set forth in the instant disclosure.

Communication interface 722 broadly represents any type or form of communication device or adapter capable of facilitating communication between exemplary computing system 710 and one or more additional devices. For example, in certain embodiments communication interface 722 may facilitate communication between computing system 710 and a private or public network including additional computing systems. Examples of communication interface 722 include, without limitation, a wired network interface (such as a network interface card), a wireless network interface (such as a wireless network interface card), a modem, and any other suitable interface. In at least one embodiment, communication interface 722 may provide a direct connection to a remote server via a direct link to a network, such as the Internet. Communication interface 722 may also indirectly provide such a connection through, for example, a local area network (such as an Ethernet network), a personal area network, a telephone or cable network, a cellular telephone connection, a satellite data connection, or any other suitable connection.

In certain embodiments, communication interface 722 may also represent a host adapter configured to facilitate communication between computing system 710 and one or more additional network or storage devices via an external bus or communications channel. Examples of host adapters include, without limitation, SCSI host adapters, USB host adapters, IEEE 1394 host adapters, SATA and eSATA host adapters, ATA and PATA host adapters, Fibre Channel interface adapters, Ethernet adapters, or the like. Communication interface 722 may also allow computing system 710 to engage in distributed or remote computing. For example, communication interface 722 may receive instructions from a remote device or send instructions to a remote device for execution. In certain embodiments, communication interface 722 may perform and/or be a means for performing, either alone or in combination with other elements, one or more of the identifying, selecting, generating, storing, retrieving, solving, and/or using steps disclosed herein. Communication interface 722 may also be used to perform and/or be a means for performing other steps and features set forth in the instant disclosure.

As illustrated in FIG. 7, computing system 710 may also include at least one display device 724 coupled to communication infrastructure 712 via a display adapter 726. Display device 724 generally represents any type or form of device capable of visually displaying information forwarded by display adapter 726. Similarly, display adapter 726 generally represents any type or form of device configured to forward graphics, text, and other data from communication infrastructure 712 (or from a frame buffer, as known in the art) for display on display device 724.

As illustrated in FIG. 7, exemplary computing system 710 may also include at least one input device 728 coupled to communication infrastructure 712 via an input interface 730. Input device 728 generally represents any type or form of input device capable of providing input, either computer or human generated, to exemplary computing system 710. Examples of input device 728 include, without limitation, a keyboard, a pointing device, a speech recognition device, or any other input device. In at least one embodiment, input device 728 may perform and/or be a means for performing, either alone or in combination with other elements, one or more of the identifying, selecting, generating, storing, retrieving, solving, and/or using steps disclosed herein. Input device 728 may also be used to perform and/or be a means for performing other steps and features set forth in the instant disclosure.

As illustrated in FIG. 7, exemplary computing system 710 may also include a primary storage device 732 and a backup storage device 733 coupled to communication infrastructure 712 via a storage interface 734. Storage devices 732 and 733 generally represent any type or form of storage device or medium capable of storing data and/or other computer-readable instructions. For example, storage devices 732 and 733 may be a magnetic disk drive (e.g., a so-called hard drive), a floppy disk drive, a magnetic tape drive, an optical disk drive, a flash drive, or the like. Storage interface 734 generally represents any type or form of interface or device for transferring data between storage devices 732 and 733 and other components of computing system 710.

In certain embodiments, storage devices 732 and 733 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 732 and 733 may also include other similar structures or devices for allowing computer software, data, or other computer-readable instructions to be loaded into computing system 710. For example, storage devices 732 and 733 may be configured to read and write software, data, or other computer-readable information. Storage devices 732 and 733 may also be a part of computing system 710 or may be a separate device accessed through other interface systems.

In certain embodiments, storage devices 732 and 733 may be used, for example, to perform and/or be a means for performing, either alone or in combination with other elements, one or more of the identifying, selecting, generating, storing, retrieving, solving, and/or using steps disclosed herein. Storage devices 732 and 733 may also be used to perform and/or be a means for performing other steps and features set forth in the instant disclosure.

Many other devices or subsystems may be connected to computing system 710. Conversely, all of the components and devices illustrated in FIG. 7 need not be present to practice the embodiments described and/or illustrated herein. The devices and subsystems referenced above may also be interconnected in different ways from that shown in FIG. 7. Computing system 710 may also employ any number of software, firmware, and/or hardware configurations. For example, one or more of the exemplary embodiments disclosed herein may be encoded as a computer program (also referred to as computer software, software applications, computer-readable instructions, or computer control logic) on a computer-readable medium. The phrase "computer-readable medium" generally refers to any form of device, carrier, or medium capable of storing or carrying computer-readable instructions. Examples of computer-readable media include, without limitation, transmission-type media, such as carrier waves, and physical media, such as magnetic-storage media (e.g., hard disk drives and floppy disks), optical-storage media (e.g., CD- or DVD-ROMs), electronic-storage media (e.g., solid-state drives and flash media), and other distribution systems.

The computer-readable medium containing the computer program may be loaded into computing system 710. All or a portion of the computer program stored on the computer-readable medium may then be stored in system memory 716 and/or various portions of storage devices 732 and 733. When executed by processor 714, a computer program loaded into computing system 710 may cause processor 714 to perform and/or be a means for performing the functions of one or more of the exemplary embodiments described and/or illustrated herein. Additionally or alternatively, one or more of the exemplary embodiments described and/or illustrated herein may be implemented in firmware and/or hardware. For example, computing system 710 may be configured as an application specific integrated circuit (ASIC) adapted to implement one or more of the exemplary embodiments disclosed herein.

FIG. 8 is a block diagram of an exemplary network architecture 800 in which client systems 810, 820, and 830 and servers 840 and 845 may be coupled to a network 850. Client systems 810, 820, and 830 generally represent any type or form of computing device or system, such as exemplary computing system 710 in FIG. 7. In one example, client system 810 may include system 100 from FIG. 1.

Similarly, servers 840 and 845 generally represent computing devices or systems, such as application servers or database servers, configured to provide various database services and/or run certain software applications. Network 850 generally represents any telecommunication or computer network including, for example, an intranet, a wide area network (WAN), a local area network (LAN), a personal area network (PAN), or the Internet.

As illustrated in FIG. 8, one or more storage devices 860(1)-(N) may be directly attached to server 840. Similarly, one or more storage devices 870(1)-(N) may be directly attached to server 845. Storage devices 860(1)-(N) and storage devices 870(1)-(N) generally represent any type or form of storage device or medium capable of storing data and/or other computer-readable instructions. In certain embodiments, storage devices 860(1)-(N) and storage devices 870(1)-(N) may represent network-attached storage (NAS) devices configured to communicate with servers 840 and 845 using various protocols, such as NFS, SMB, or CIFS.

Servers 840 and 845 may also be connected to a storage area network (SAN) fabric 880. SAN fabric 880 generally represents any type or form of computer network or architecture capable of facilitating communication between a plurality of storage devices. SAN fabric 880 may facilitate communication between servers 840 and 845 and a plurality of storage devices 890(1)-(N) and/or an intelligent storage array 895. SAN fabric 880 may also facilitate, via network 850 and servers 840 and 845, communication between client systems 810, 820, and 830 and storage devices 890(1)-(N) and/or intelligent storage array 895 in such a manner that devices 890(1)-(N) and array 895 appear as locally attached devices to client systems 810, 820, and 830. As with storage devices 860(1)-(N) and storage devices 870(1)-(N), storage devices 890(1)-(N) and intelligent storage array 895 generally represent any type or form of storage device or medium capable of storing data and/or other computer-readable instructions.

In certain embodiments, and with reference to exemplary computing system 710 of FIG. 7, a communication interface, such as communication interface 722 in FIG. 7, may be used to provide connectivity between each client system 810, 820, and 830 and network 850. Client systems 810, 820, and 830 may be able to access information on server 840 or 845 using, for example, a web browser or other client software. Such software may allow client systems 810, 820, and 830 to access data hosted by server 840, server 845, storage devices 860(1)-(N), storage devices 870(1)-(N), storage devices 890 (1)-(N), or intelligent storage array 895. Although FIG. 8 depicts the use of a network (such as the Internet) for exchanging data, the embodiments described and/or illustrated herein are not limited to the Internet or any particular network-based environment.

In at least one embodiment, all or a portion of one or more of the exemplary embodiments disclosed herein may be encoded as a computer program and loaded onto and executed by server 840, server 845, storage devices 860(1)-(N), storage devices 870(1)-(N), storage devices 890(1)-(N), intelligent storage array 895, or any combination thereof. All or a portion of one or more of the exemplary embodiments disclosed herein may also be encoded as a computer program, stored in server 840, run by server 845, and distributed to client systems 810, 820, and 830 over network 850. Accordingly, network architecture 800 may perform and/or be a means for performing, either alone or in combination with other elements, one or more of the identifying, selecting, generating, storing, retrieving, solving, and/or using steps disclosed herein. Network architecture 800 may also be used to perform and/or be a means for performing other steps and features set forth in the instant disclosure.

As detailed above, computing system 710 and/or one or more components of network architecture 800 may perform and/or be a means for performing, either alone or in combination with other elements, one or more steps of an exemplary method for redundant data storage.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

While various embodiments have been described and/or illustrated herein in the context of fully functional computing systems, one or more of these exemplary embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. In some embodiments, these software modules may configure a computing system to perform one or more of the exemplary embodiments disclosed herein.

In addition, one or more of the modules described herein may transform data, physical devices, and/or representations of physical devices from one form to another. For example, one or more of the modules described herein may transform a storage system into an efficient and reliable system for redundant data storage.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "a" or "an," as used in the specification and claims, are to be construed as meaning "at least one of." In addition, for ease of use, the words "including" and "having," as used in the specification and claims, are interchangeable with and have the same meaning as the word "comprising."

What is claimed is:

1. A computer-implemented method for redundant data storage, at least a portion of the method being performed by a computing device comprising at least one processor, the method comprising:
    identifying a storage system;
    identifying a unit of data to be redundantly stored;
    identifying a set of pairwise coprimes;
    identifying an integer that represents the unit of data;
    generating a set of shares, each share comprising a reduction of the integer modulo a corresponding pairwise coprime in the set of pairwise coprimes;
    redundantly storing the unit of data by storing the set of shares on the storage system.

2. The computer-implemented method of claim 1, wherein the unit of data comprises a stripe of data.

3. The computer-implemented method of claim 2, wherein identifying the unit of data comprises:
    identifying a volume of data to be redundantly stored;
    dividing the volume of data into a plurality of stripes;
    selecting the stripe of data from the plurality of stripes.

4. The computer-implemented method of claim 1, wherein the storage system comprises a distributed storage system.

5. The computer-implemented method of claim 1, wherein the storage system comprises an archival storage system.

6. The computer-implemented method of claim 1, wherein identifying the set of pairwise coprimes comprises:
    identifying a minimum number of shares to guarantee future decoding of the integer;
    selecting the set of pairwise coprimes such that a product of members of any subset of the set of pairwise coprimes with a cardinality equal to the minimum number of shares will exceed the value of the integer.

7. The computer-implemented method of claim 1, wherein identifying the set of pairwise coprimes comprises selecting a number of pairwise coprimes equal to the number of shares to generate.

8. The computer-implemented method of claim 1, wherein identifying the set of pairwise coprimes comprises:
    identifying a maximum share size;
    selecting the set of pairwise coprimes such that each pairwise coprime is small enough to be stored within the maximum share size.

9. A computer-implemented method for redundant data storage, at least a portion of the method being performed by a computing device comprising at least one processor, the method comprising:
    identifying a storage system;
    identifying a set of pairwise coprimes;
    retrieving a set of shares from the storage system, each share comprising a reduction of an integer modulo a corresponding pairwise coprime in the set of pairwise coprimes;
    solving a system of simultaneous congruences, each congruence in the system comprising a congruence between the integer and a share in the set of shares modulo a corresponding pairwise coprime in the set of pairwise coprimes;
    identifying a unit of data corresponding to the integer.

10. The computer-implemented method of claim 9, wherein the unit of data comprises a stripe of data.

11. The computer-implemented method of claim 9, wherein the storage system comprises a distributed storage system.

12. The computer-implemented method of claim 9, wherein the storage system comprises an archival storage system.

13. The computer-implemented method of claim 9, wherein solving the system of simultaneous congruences comprises using an extended Euclidean algorithm.

14. A system for redundant data storage, the system comprising:
- an identification module programmed to:
  - identify a storage system;
  - identify a set of pairwise coprimes;
  - identify a unit of data to be redundantly stored;
- an encoding module programmed to:
  - identify an integer that represents the unit of data;
  - generate a set of shares, each share comprising a reduction of the integer modulo a corresponding pairwise coprime in the set of pairwise coprimes;
- a storage module programmed to redundantly store the unit of data by storing the set of shares on the storage system;
- a retrieval module programmed to retrieve the set of shares from the storage system;
- a decoding module programmed to:
  - solve a system of simultaneous congruences, each congruence in the system comprising a congruence between the integer and a share in the set of shares modulo a corresponding pairwise coprime in the set of pairwise coprimes;
  - identify a unit of data corresponding to the integer;
- at least one processor configured to execute the identification module, the encoding module, the storage module, the retrieval module, and the decoding module.

15. The system of claim 14, wherein the unit of data comprises a stripe of data.

16. The system of claim 15, wherein the identification module is programmed to identify the unit of data by:
- identifying a volume of data to be redundantly stored;
- dividing the volume of data into a plurality of stripes;
- selecting the stripe of data from the plurality of stripes.

17. The system of claim 14, wherein the storage system comprises a distributed storage system.

18. The system of claim 14, wherein the storage system comprises an archival storage system.

19. The system of claim 14, wherein the identification module is programmed to identify the set of pairwise coprimes by:
- identifying a minimum number of shares to guarantee future decoding of the integer;
- selecting the set of pairwise coprimes such that a product of members of any subset of the set of pairwise coprimes with a cardinality equal to the minimum number of shares will exceed the value of the integer.

20. The system method of claim 14, wherein the identification module is programmed to identify the set of pairwise coprimes by selecting a number of pairwise coprimes equal to the number of shares to generate.

* * * * *

UNITED STATES PATENT AND TRADEMARK OFFICE
CERTIFICATE OF CORRECTION

PATENT NO.         : 8,225,040 B1                                                Page 1 of 1
APPLICATION NO.    : 12/723335
DATED              : July 17, 2012
INVENTOR(S)        : Avinash Ramesh Patil et al.

It is certified that error appears in the above-identified patent and that said Letters Patent is hereby corrected as shown below:

On the Title Page:

The Inventors should read–

Avinash Ramesh Patil, Maharashtra (IN); Dilip Ranade, Maharashtra (IN)

Signed and Sealed this
Eighteenth Day of December, 2012

David J. Kappos
*Director of the United States Patent and Trademark Office*